US 6,573,147 B2

(12) United States Patent
Moon et al.

(10) Patent No.: US 6,573,147 B2
(45) Date of Patent: Jun. 3, 2003

(54) METHOD OF FORMING A SEMICONDUCTOR DEVICE HAVING CONTACT USING CRACK-PROTECTING LAYER

(75) Inventors: Kwang-jin Moon, Yongin (KR); Hee-sook Park, Seoul (KR); Myoung-bum Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/055,260

(22) Filed: Oct. 26, 2001

(65) Prior Publication Data

US 2002/0125543 A1 Sep. 12, 2002

(51) Int. Cl.⁷ ............................................. H01L 21/331
(52) U.S. Cl. ....................... 438/348; 438/348; 438/253; 257/508
(58) Field of Search ................. 257/508, 506; 438/348, 253, 46, 692

(56) References Cited

U.S. PATENT DOCUMENTS

| 4,835,008 A | 5/1989 | DiStefano ............... 427/96 |
| 5,506,177 A | 4/1996 | Kishimoto et al. ........ 437/195 |
| 5,963,787 A | * 10/1999 | Kimura et al. ............ 438/46 |
| 6,020,236 A | * 2/2000 | Lee et al. ................. 438/253 |
| 6,077,790 A | 6/2000 | Li et al. ................... 438/739 |
| 6,174,814 B1 | * 1/2001 | Cook et al. ............... 438/692 |

FOREIGN PATENT DOCUMENTS

| JP | 7-240460 | 4/1996 | ......... H01L/21/44 |
| JP | 10-22390 | 1/1998 | ........ H01L/21/768 |
| JP | 00-183051 | 6/2000 | ........ H01L/21/312 |
| JP | 00-357734 | 12/2000 | ........ H01L/21/768 |
| KR | 2001-0004989 | 1/2001 | ....... H01L/21/8239 |

OTHER PUBLICATIONS

US Patent Application US 2002/0089031A by Ang et al. US class 257/506.*

* cited by examiner

Primary Examiner—David Nelms
Assistant Examiner—Thinh Nguyen
(74) Attorney, Agent, or Firm—Mills & Onello LLP

(57) ABSTRACT

A semiconductor device having a contact using a crack-protecting layer and a method of forming the same are provided. The crack-protecting layer formed of a dielectric material is formed on an interlayer dielectric layer. The crack-protecting layer relieves or absorbs residual stress generated on a conductive layer used in forming a contact plug. Thus, a contact can be formed without damage to the interlayer dielectric layer due to residual stress.

17 Claims, 6 Drawing Sheets

METHOD OF FORMING A SEMICONDUCTOR DEVICE HAVING CONTACT USING CRACK-PROTECTING LAYER

BACKGROUND OF THE INVENTION

1. Field of the Invention

The present invention relates to a semiconductor device and a method of forming the same, and more particularly, to a semiconductor device having a contact and a method of forming the same.

2. Description of the Related Art

As the integration density of semiconductor devices increases, the area of cells formed in semiconductor devices and the critical dimension CD of bit lines decrease considerably. Also, contact holes connecting bit lines and lower conductive layers are refined. As a result, the ratio of the depth to the diameter of a contact hole, i.e., the aspect ratio, is increased, and the contact hole needs a plug material having excellent gap-filling characteristics.

FIGS. 1 through 4 are cross-sectional views describing a semiconductor device having a general contact and the steps of a method of forming the same. Referring to FIG. 1, an interlayer dielectric layer 14 is formed on a semiconductor substrate 10 having a lower conductive layer 12. A contact hole 16 is formed by selectively etching a portion of the interlayer dielectric layer 14 to expose the lower conductive layer 12.

With reference to FIG. 2, an ohmic layer 18 is formed by depositing a conductive material on the exposed lower conductive layer 12. A first barrier layer 20 is formed on the entire surface of the contact hole 16 and the interlayer dielectric layer 14 by a blanket method.

Referring to FIG. 3, a conductive layer 22 is formed on the entire surface of the semiconductor substrate 10, on which the first barrier layer 20 is formed, to form a contact plug. The conductive layer 22 is formed of a material having excellent gap-filling capability and step coverage for the contact hole 16.

With reference to FIG. 4, the first barrier layer 20 and the conductive layer 22 are removed and planarized to expose the surface of the interlayer dielectric layer 14 by using chemical mechanical polishing and an etch back process. A second barrier layer 24 and an upper conductive layer pattern 26 are sequentially formed on a contact plug 22' that is formed by a planarization process.

In general, tungsten W is used as the material for the contact plug 22' because tungsten has low contact resistance, excellent adhesion, and fine step coverage to the ohmic layer 18. However, fluorine F contained in a tungsten plug moves to the ohmic layer 18 when thermally treated and thus, nonconductive Ti—F compound is formed. In order to solve this problem, titanium nitride TiN has recently been used as the contact plug 22'.

Residual stress is generated in a process of forming the conductive layer 22 for forming a contact plug. For example, titanium nitride TiN is generally deposited to a thickness of 1500 Å or more to fill the contact hole 16 fully. In this case, the titanium nitride TiN layer is cracked due to residual stress while stabilizing the titanium nitride TiN layer after the deposition. Also, the crack in the titanium nitride TiN layer causes a crack in the interlayer dielectric layer 14. The probability of a crack occurring increases with an increase in the aspect ratio of the contact hole 16.

SUMMARY OF THE INVENTION

To solve the above problems, it is a first object of the present invention to provide a method of forming a contact which can prevent damage to an interlayer dielectric layer due to residual stress generated on a conductive layer use in forming a contact plug.

It is a second object of the present invention to provide a semiconductor device having a contact which can prevent damage to an interlayer dielectric layer due to residual stress generated on a conductive layer used in forming a contact plug.

Accordingly, in accordance with a first aspect of the invention, there is provided a method of forming a contact using a crack-protecting layer. An interlayer dielectric layer is formed on a semiconductor substrate on which a lower conductive layer is formed. A crack-protecting layer is formed of a dielectric layer on the interlayer dielectric layer. A contact hole is formed by etching the crack-protecting layer and the interlayer dielectric layer to expose the lower conductive layer. A conductive layer is formed to form a contact plug which fills the contact hole and covers the semiconductor substrate. The conductive layer is planarized.

The crack-protecting layer relieves or absorbs residual stress transferred from the conductive layer to the interlayer dielectric layer. The crack-protecting layer may be formed by a chemical vapor deposition (CVD) method or a spin-on glass (SOG) method.

The crack-protecting layer formed by the CVD method can be a single layer formed of one of SiOF, SiN, SiO$_2$, SiOC, and TEOS, or is a compound layer containing at least one of SiOF, SiN, SiO$_2$, SiOC, and TEOS. The crack-protecting layer formed by the SOG method can be a single layer containing one of a material having an inorganic silicide source and a material having an organic siloxane source, or can be a compound layer containing at least one of a material having an inorganic silicide source and a material having an organic siloxane source. The interlayer dielectric layer is formed of a material which is easily cracked due to residual stress transferred from the conductive layer.

In accordance with a second aspect of the invention, there is provided a semiconductor device in which a contact is formed using a crack-protecting layer. The semiconductor device includes a semiconductor substrate having a lower conductive layer; an interlayer dielectric layer formed on the semiconductor substrate and having a contact hole exposing the lower conductive layer; a crack-protecting layer formed on the interlayer dielectric layer; a contact plug for filling the contact hole; and an upper conductive layer formed on the contact plug.

The crack-protecting layer can be a single layer formed of one of SiOF, SiN, SiON, SiO$_2$, SiOC, and TEOS, or a compound layer containing at least one of SiOF, SiN, SiON, SiO$_2$, SiOC, and TEOS. The crack-protecting layer has a thickness of 100–1500 Å.

When a contact plug is formed, a crack-protecting layer relieving or absorbing residual stress is formed. As a result, a contact is formed without damage to an interlayer dielectric layer.

BRIEF DESCRIPTION OF THE DRAWINGS

The foregoing and other objects, features and advantages of the invention will be apparent from the following more particular description of preferred embodiments of that invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
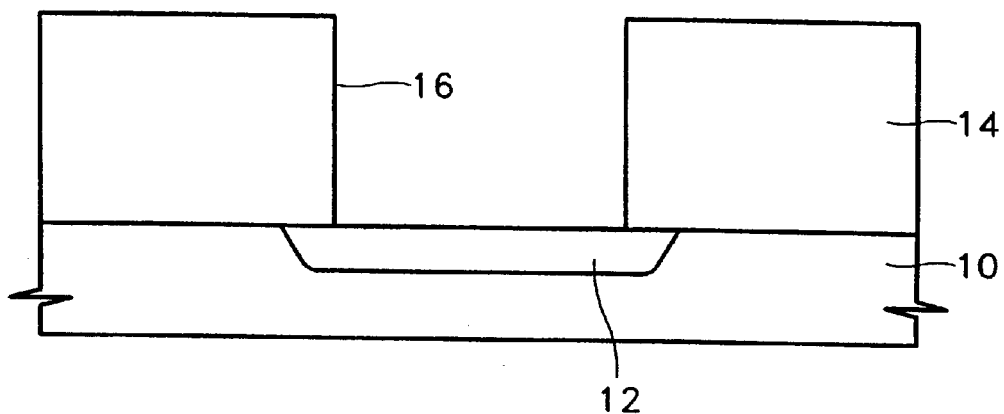
FIGS. 1 through 4 are cross-sectional views illustrating a semiconductor device having a general contact and the steps of a method of forming the same.
Figure 2:
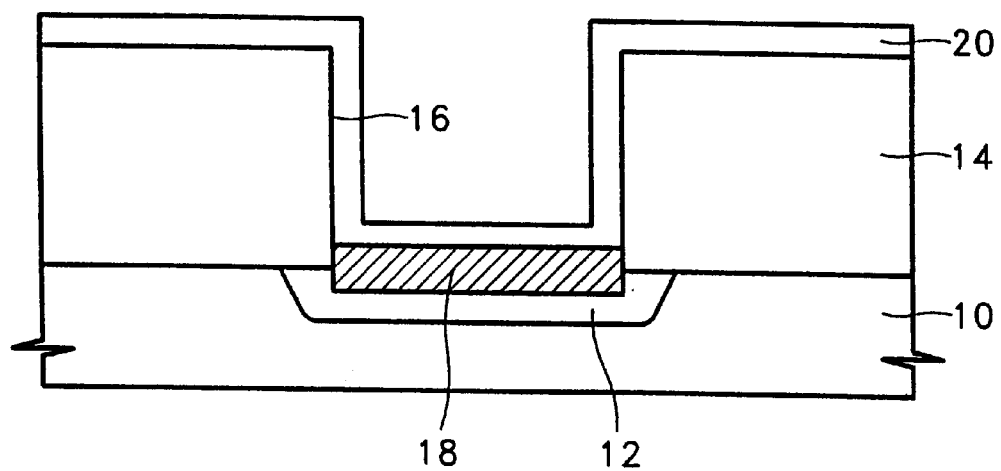
Figure 3:
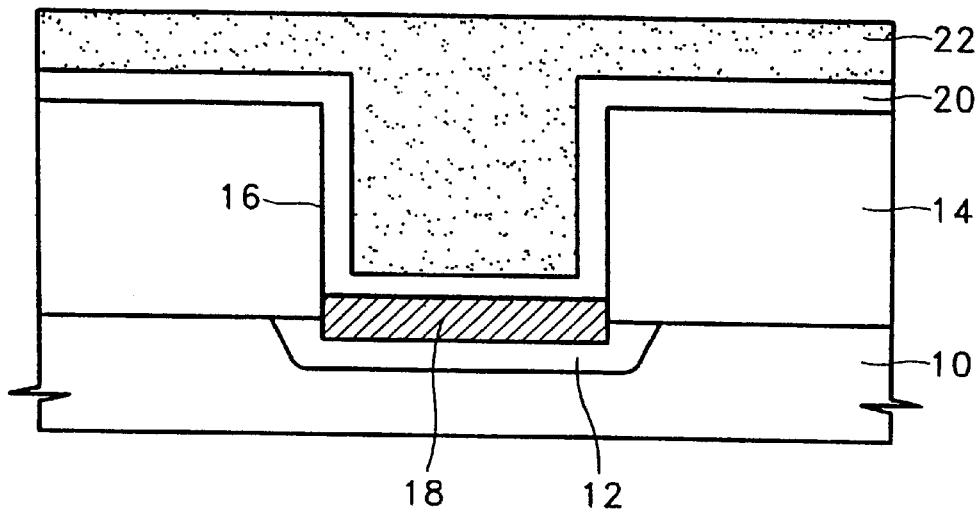
Figure 4:
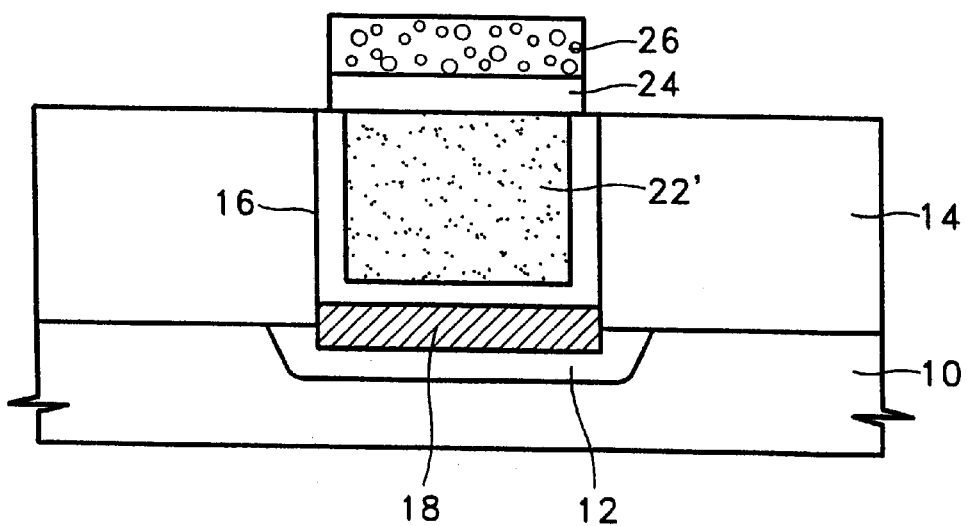

Hereinafter, embodiments of the present invention will be described in detail with reference to the attached drawings. In the drawings, the thicknesses of layers or regions are exaggerated for clarity. Also, when a layer is described as being formed "on" another layer or a substrate, the layer can be formed directly on the other layer or the substrate, or other layers can intervene therebetween.

Figure 5:
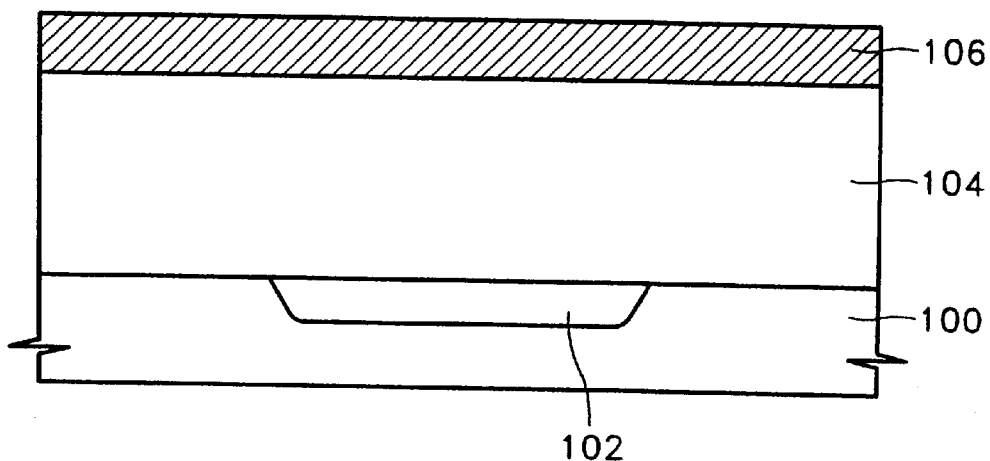
FIGS. 5 through 9 are cross-sectional views illustrating a semiconductor device having a contact invention and the steps of a method of forming the same according to a first embodiment of the present.

FIGS. 5 through 9 are cross-sectional views illustrating a semiconductor device having a contact according to a first embodiment of the present invention and the steps of a method of forming the same. Referring to FIG. 5, an interlayer dielectric layer 104 is formed on a semiconductor substrate 100 having a lower conductive layer 102. A crack-protecting layer 106 is formed on the entire surface of the interlayer dielectric layer 104. Here, the interlayer dielectric layer 104 is a dielectric layer, such as a silicon oxide layer or silicon nitride layer. The crack-protecting layer 106 relieves or absorbs residual stress generated on a conductive layer 114 used in forming a contact plug in a subsequent process. Also, it is preferable that the crack-protecting layer 106 be formed of a dielectric material. The dielectric material may be formed by a chemical vapor deposition (CVD) method, a physical vapor deposition (PVD) method, or a spin-on glass (SOG) method.

For example, a single layer may be formed of a dielectric material, e.g., one of SiOF, SiN, SiON, $SiO_2$, SiOC, and TEOS or a compound layer containing at least one of SiOF, SiN, SiON, $SiO_2$, SiOC, and TEOS, by a CVD method. The single layer or a compound layer containing at least one of a dielectric material having an inorganic silicide source and a dielectric material having an organic siloxane source may be coated using an SOG method. The layer coated by the SOG method is heat-treated or microwave-treated by a tube method. In the microwave-treatment, microwaves irradiate to the coated layer to cure a movable layer. In the tube method, a semiconductor substrate with a layer that is coated by an SOG method is loaded in a tube and then is heat-treated using a heating plate installed outside the tube.

Describing the heat-treatment in detail, a solvent is removed by heat-treatment at a temperature of 100–350° C. An additional heat-treatment may be performed at a temperature of about 400° C. if it is needed. Another heat-treatment is performed at a temperature of 700–130° C. to cross-link the movable layer. Here, it is possible to perform heat-treatment under a dry atmosphere or a wet atmosphere, preferably, under an $N_2$ atmosphere.

Figure 7:
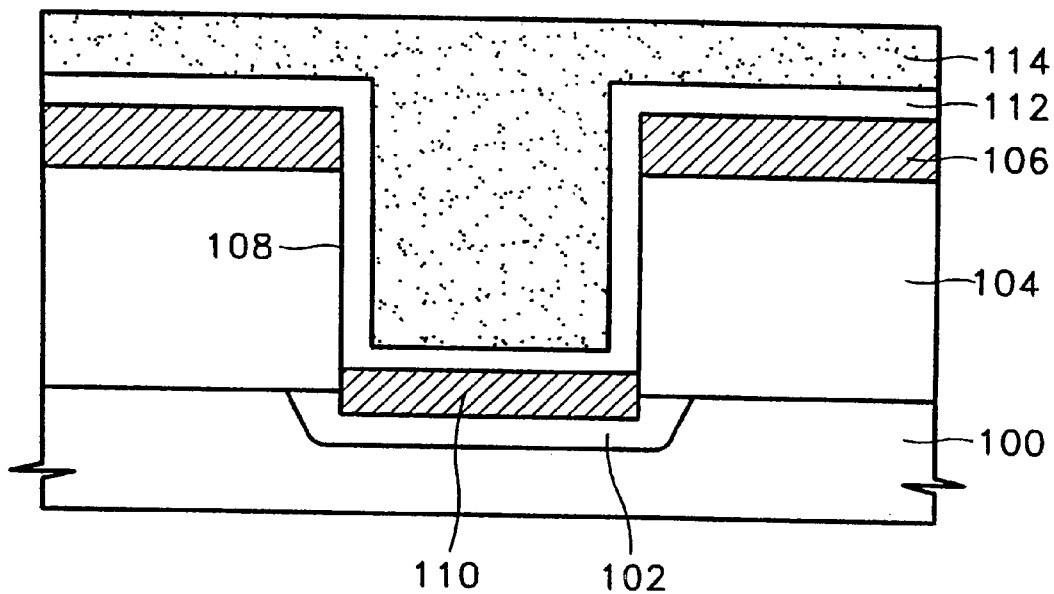

Meanwhile, the crack-protecting layer 106 relieves or absorbs residual stress generated on a conductive layer 114 which will be formed in a subsequent process, as shown in FIG. 7. For example, when the conductive layer 114 is formed by manufacturing titanium nitride TiN by a CVD method, the conductive layer 114 is deposited to a thickness of 1500 Å or more to fully fill a gap. In this case, residual stress having tensile force of $10^{10}/cm^2$ dyne or more is generated on the titanium nitride TiN layer. Also, in a case where the conductive layer 114 is formed of metal such as tungsten W or copper Cu, residual stress of about $5 \times 10^9/cm^2$ dyne or more occurs. Residual stress damages the conductive layer 114 and spreads to the interlayer dielectric layer 104, also damaging it. For example, the titanium nitride TiN layer is cracked by residual stress. The crack may spread to the interlayer dielectric layer 104. The crack-protecting layer 106 is itself cracked and absorbs the residual stress. In other words, the crack-protecting layer 106 prevents the crack from spreading to the interlayer dielectric layer 104. Damage to the interlayer dielectric layer 104 due to residual stress is increased as the depth of a contact hole is deepened with a decrease in the size of a semiconductor device.

The crack-protecting layer 106 according to the present invention is formed of a dielectric material. If the crack-protecting layer 106 is formed of a conductive material, the conductive material or residue thereof may have an electrically negative effect on electrodes or bit lines on the lower conductive layer 102. It is preferable that the crack-protecting layer 106 has a thickness of 100–1500 Å. Here, the thickness of the crack-protecting layer 106 can be designed in consideration of the material used for the conductive layer 114 and how the material reacts to residual stress. For example, if the conductive layer 114 is formed of copper Cu, the crack-protecting layer 106 may be thin, and if the conductive layer 114 is titanium nitride TiN, the crack-protecting layer 106 may be relatively thick.

Figure 6:
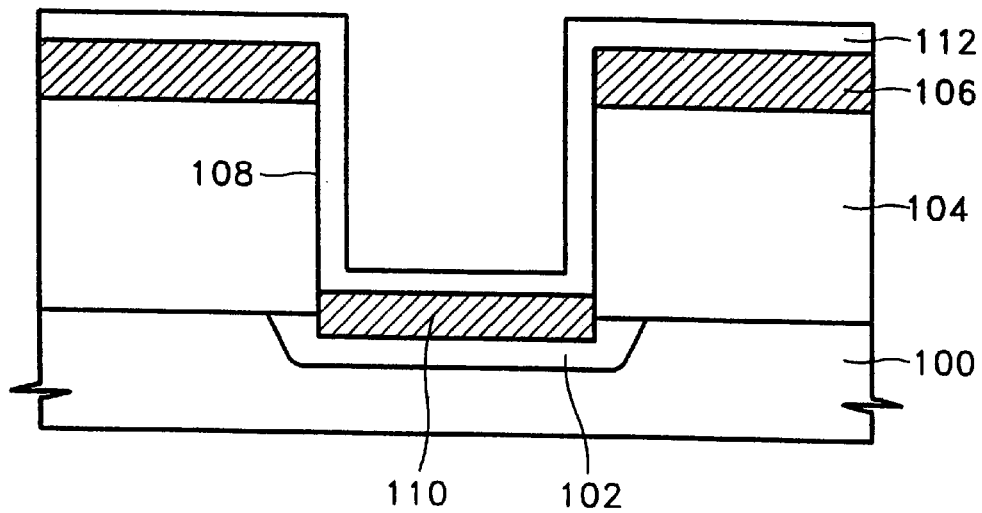

With reference to FIG. 6, a contact hole 108 is formed by etching a portion of the crack-protecting layer 106 and the interlayer dielectric layer 104 selectively to expose the lower conductive layer 102. A reactive metal layer (not shown) is deposited and heat-treated on the entire surface of the contact hole 108 and the interlayer dielectric layer 104. Here, an ohmic layer 110 is formed on the lower conductive layer 102 exposed on the bottom of the contact hole 108 by the reactive metal. In the step of forming the ohmic layer 110, a reactive metal layer (not shown) is deposited by a CVD method, plasma enhanced (PE) CVD method, or a PVD method. A heatproof metal such as Ti, Ta, or W may be used for the reactive metal layer. In the case of using a CVD method or PECVD method, the reactive metal is preferably deposited at a temperature of about 400–800° C. In the case of using a PVD method, the reactive metal is preferably deposited at a temperature of about 30–400° C. In the semiconductor substrate 100 on which the reactive metal layer (not shown) is heat-treated, reactive metal reacts to silicon of the lower conductive layer 102, thereby forming silicide. Here, the heat-treatment may be performed at a temperature of about 500–800° C. in a vacuum environment or nitride environment, e.g., $N_2$ or $NH_3$.

A first barrier layer 112 is deposited by a blanket method on the entire surface of the semiconductor substrate 100 on which the contact hole 108 is formed. The first barrier layer 112 prevents a reaction between the material of the conductive layer 114 and the interlayer dielectric layer 104. It is preferable that the first barrier layer 112 be formed of a conductive material. For example, the barrier layer 112 may be a single layer formed of one of Ti, TiN, TaN, W, WN, SiN, and WSiN or may be a compound layer containing at least one of Ti, TiN, TaN, W, WN, SiN, and WSiN. However, in a case where the conductive layer 114 is formed of TiN, the first barrier layer 112 is not necessary and may not be formed. Also, it is preferable that the first barrier layer 112 have a thickness of 300–1000 Å.

Referring to FIG. 7, a conductive layer 114 is formed on the entire surface of the first barrier layer 112 to form a contact plug. Here, the conductive layer 114 is formed of a material having excellent gap filling capability and step coverage for the contact hole 108. For example, the conductive layer 114 may be a single layer formed of one of Cu, Al, W, Ti, Zr, Hf, V, Mo, and Cr or may be a compound layer containing at least one of Cu, Al, W, Ti, Zr, Hf, V, Mo, and Cr. Also, the conductive layer 114 may be formed of a material nitrified or carbonized with one of Cu, Al, W, Ti, Zr, Hf, V, Mo, and Cr, formed of metallic silicide, or formed of polysilicon doped with impurities. In particular, it is preferable that the conductive layer 114 be formed of TiN.

Figure 8:
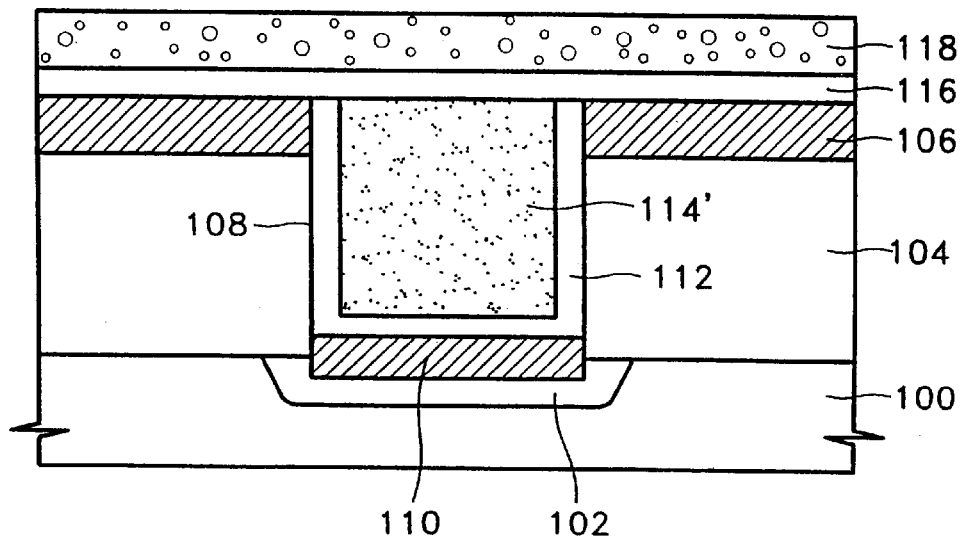

With reference to FIG. 8, the first barrier layer 112 and the conductive layer 114 formed on the crack-protecting layer 106 are removed and planarized by chemical mechanical polishing or an etch back process. As a result, a contact plug 114' is formed in the contact hole 108 in the interlayer dielectric layer 104. A second barrier layer 116 and an upper conductive layer 118 are sequentially formed on the planarized surface. The second barrier layer 116 prevents a reaction between the upper conductive layer 118 and the contact plug 114'. Here, it is preferable that the second barrier layer 116 be formed of a conductive material. For example, the second barrier layer 116 may be a single layer formed of one of Ti, TiN, TaN, W, WN, SiN and WSiN or may be a compound layer containing at least one of Ti, TiN, TaN, W, WN, SiN and WSiN. It is preferable that the second barrier layer 116 have a thickness of 300–1000 Å. Also, the upper conductive layer 118 may be a single layer formed of one of Cu, Al, W, Ti, Zr, Hf, V, Mo, and Cr or may be a compound layer containing at least one of Cu, Al, W, Ti, Zr, Hf, V, Mo, and Cr.

Figure 9:
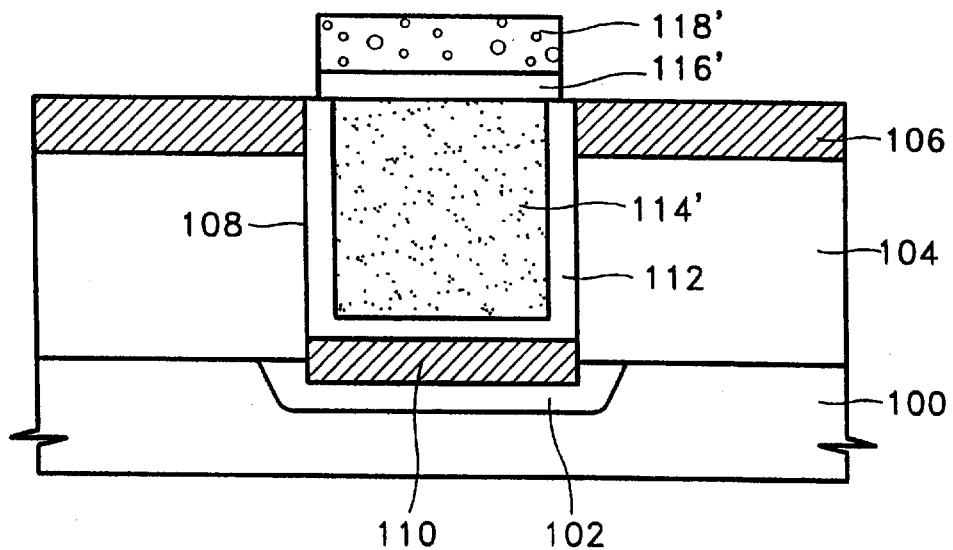

Referring to FIG. 9, the upper conductive layer 118 is coated with a photoresist layer (not shown) for forming an upper conductive layer pattern 118' and a second barrier layer pattern 116'. A photoresist pattern (not shown) is formed to define the upper conductive layer pattern 118' and the second barrier layer pattern 116'. The upper conductive layer pattern 118' and the second barrier layer pattern 116' are formed by removing the upper conductive layer 118 and the second barrier layer 116 using the photoresist pattern as an etching mask.

Figure 10:
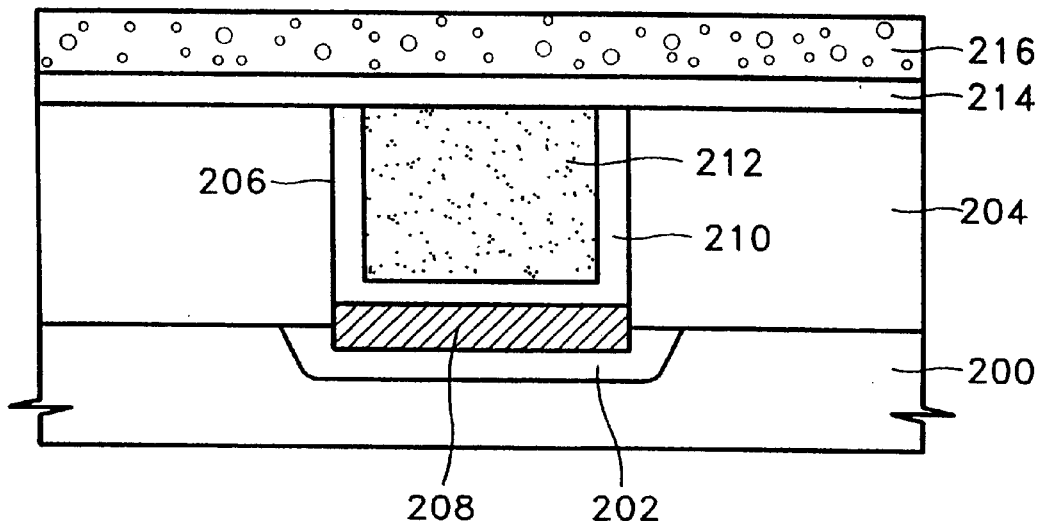
FIGS. 10 through 11 are cross-sectional views illustrating a semiconductor device having a contact invention and the steps of a method of forming the same according to a second embodiment of the present.
Figure 11:
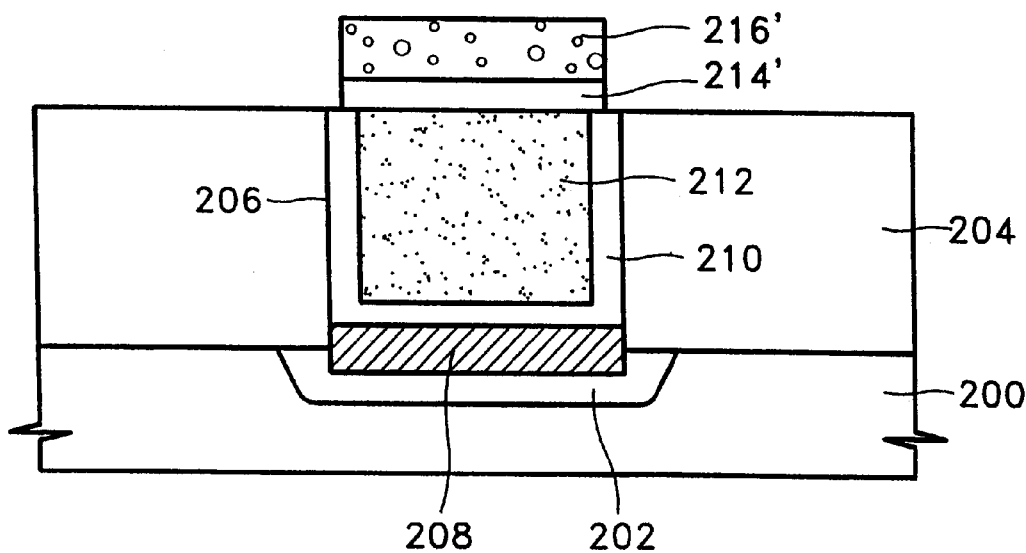

FIGS. 10 and 11 are cross-sectional views describing a semiconductor device having a contact according to a second embodiment of the present invention and the steps of a method of forming the same. Referring to FIG. 10, an interlayer dielectric layer 204, a crack-protecting layer 106 (See FIG. 5), a first barrier layer 210, and a conductive layer 114 (See FIG. 7) for forming a contact plug are formed by the same method as in FIGS. 5 through 9. The conductive layer 114, the first barrier layer 210, and the crack-protecting layer 106 formed on the interlayer dielectric layer 204 are sequentially removed and planarized by CMP or an etch back process. As a result, a contact plug 212 is formed in the contact hole 206 in the interlayer dielectric layer 204. A second barrier layer 214 and an upper conductive layer 216 are formed on the planarized surface. Here, the second barrier layer 214 prevents a reaction between the upper conductive layer 216 and the contact plug 212. The second barrier layer 214 and the upper conductive layer 216 are formed of the same materials described in connection with FIG. 8 and are deposited to a thickness of 100–1000 Å. In a case where the contact plug 212 is formed of TiN, the crack-protecting layer 106 is easily cracked. Thus, in this embodiment of the invention, in contrast to the previous embodiment, it is preferable that the crack-protecting layer 106 be removed.

With reference to FIG. 11, a second barrier layer pattern 214' and an upper conductive layer pattern 216' are formed as described in FIG. 9.

As described above, in a semiconductor device having a contact using a crack-protecting layer according to the present invention and a method of forming the same, a crack-protecting layer is formed to relieve or absorb residual stress generated on a conductive layer for forming a contact plug. As a result, a contact can be formed to prevent damage to an interlayer dielectric layer.

Although the invention has been described with reference to preferred embodiments, it will be apparent to one of ordinary skill in the art that modifications of the described embodiments may be made without departing from the spirit and scope of the invention.

What is claimed is:

1. A method of forming a contact comprising:
   forming an interlayer dielectric layer on a semiconductor substrate on which a lower conductive layer is formed;
   forming a crack-protecting layer on the interlayer dielectric layer, the crack protecting layer being formed of a dielectric layer;
   forming a contact hole by etching the crack-protecting layer and the interlayer dielectric layer to expose the lower conductive layer;
   forming a conductive layer for a contact plug, the conductive layer filling the contact hole and covering the semiconductor substrate; and
   planarizing the conductive layer until the interlayer dielectric layer is exposed.

2. The method of claim 1, wherein the crack-protecting layer relieves residual stress transferred from the conductive layer to the interlayer dielectric layer.

3. The method of claim 1, wherein the crack-protecting layer absorbs residual stress transferred from the conductive layer to the interlayer dielectric layer.

4. The method of claim 1, wherein the crack-protecting layer is formed by at least one of a chemical vapor deposition (CVD) method and a spin-on glass (SOG) method.

5. The method of claim 4, wherein the crack-protecting layer formed by the CVD method is a single layer formed of a material selected from the group consisting of SiOF, SiN, $SiO_2$, SiOC, TEOS, and a compound layer containing at least one of SiOF, SiN, $SiO_2$, SiOC, and TEOS.

6. The method of claim 4, wherein the crack-protecting layer formed by the SOG method is a single layer containing one of a dielectric material having an inorganic silicide source and a dielectric material having an organic siloxane source.

7. The method of claim 4, wherein the crack-protecting layer formed by the SOG method is a compound layer containing at least one of a dielectric material having an inorganic silicide source and a dielectric material having an organic siloxane source.

8. The method of claim 1, wherein the conductive layer is a material selected from the group consisting of a metallic layer, a metallic nitride layer, a metallic carbide layer, a metallic silicide layer, and a polysilicon layer doped with impurities.

9. The method of claim 8, wherein the metallic layer is a material selected from the group consisting of Cu, Al, W, Ti, Zr, Hf, V, Mo, and Cr.

10. The method of claim 1, wherein the interlayer dielectric layer is formed of a material which is easily cracked due to residual stress transferred from the conductive layer.

11. The method of claim 1, further comprising forming an ohmic layer on the bottom of the contact hole after forming the contact hole.

12. The method of claim 11, wherein the ohmic layer is formed of a material selected from the group of consisting of Ti silicide, Ta silicide, and W silicide.

13. The method of claim 11, further comprising forming a first barrier layer on the entire surface of the semiconductor substrate by a blanket method after forming the ohmic layer.

14. The method of claim 13, wherein the first barrier layer is formed of a material selected from the group consisting of Ti, TiN, TaN, W, WN, SiN, and WSiN.

15. The method of claim 1, further comprising forming an upper conductive layer after planarizing the conductive layer.

16. The method of claim 15, wherein a second barrier layer is first formed, and then the conductive layer is formed to prevent a reaction between the conductive layer and the upper conductive layer.

17. The method of claim 16, wherein the second barrier layer is formed of a material selected from the group consisting of Ti, TiN, TaN, W, WN, SiN, and WSiN.

* * * * *